United States Patent
Uchida et al.

(10) Patent No.: US 11,940,300 B2
(45) Date of Patent: *Mar. 26, 2024

(54) MAGNETIC SENSOR WITH AN ELONGATED ELEMENT

(71) Applicant: TDK Corporation, Tokyo (JP)

(72) Inventors: Keisuke Uchida, Tokyo (JP); Kazuya Watanabe, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/975,131

(22) Filed: Oct. 27, 2022

(65) Prior Publication Data

US 2023/0050532 A1 Feb. 16, 2023

Related U.S. Application Data

(63) Continuation of application No. 17/171,560, filed on Feb. 9, 2021, now Pat. No. 11,506,514, which is a (Continued)

(30) Foreign Application Priority Data

Nov. 9, 2017 (JP) .................................. 2017-216489

(51) Int. Cl.
*G01D 5/16* (2006.01)
*G01R 33/00* (2006.01)
*G01R 33/09* (2006.01)

(52) U.S. Cl.
CPC ............ *G01D 5/16* (2013.01); *G01R 33/0005* (2013.01); *G01R 33/09* (2013.01); *G01R 33/091* (2013.01); *G01R 33/093* (2013.01); *G01R 33/098* (2013.01)

(58) Field of Classification Search
CPC ..... G01D 5/12; G01D 5/14; G01D 5/16; G01R 33/02; G01R 33/06; G01R 33/09–098
See application file for complete search history.

(56) References Cited

U.S. PATENT DOCUMENTS 6,069,476 A    5/2000   Vieux-Rochaz et al.
6,462,541 B1 * 10/2002   Wang .................. G01R 33/093
                                          324/252

(Continued)

FOREIGN PATENT DOCUMENTS

CN       104103753 A    10/2014
JP        H11-087804 A    3/1999

(Continued)

OTHER PUBLICATIONS

"Oval," Wikipedia, Retrieved on Sep. 17, 2022, pp. 1-6, https://de.wikipedia.org/w/index.php?title=Oval&oldid=212866084.

(Continued)

*Primary Examiner* — Huy Q Phan
*Assistant Examiner* — David B Frederiksen
(74) *Attorney, Agent, or Firm* — POSZ LAW GROUP, PLC

(57) ABSTRACT

The magnetic sensor of the invention has an element portion that is elongate, that exhibits magnetoresistive effect and that has a magnetically sensitive axis in a direction of a short axis thereof. The element portion is non-oval and can be arranged in an imaginary ellipse, wherein the imaginary ellipse has a major axis that connects both ends of the element portion with regard to a direction of a long axis thereof to each other and a minor axis that connects both ends of the element portion with regard to a direction of the short axis thereof to each other, as viewed in a direction that is perpendicular both to the short axis and to the long axis of the element portion.

17 Claims, 15 Drawing Sheets

Related U.S. Application Data continuation of application No. 16/182,744, filed on Nov. 7, 2018, now Pat. No. 10,948,316.

(56) References Cited

U.S. PATENT DOCUMENTS

| | | |
|---|---|---|
| 6,529,114 B1 | 3/2003 | Bohlinger et al. |
| 6,576,969 B2 | 6/2003 | Tran et al. |
| 6,891,746 B2 | 5/2005 | Tran et al. |
| 6,936,903 B2 | 8/2005 | Anthony et al. |
| 6,956,270 B2 | 10/2005 | Fukuzumi |
| 7,267,998 B2 | 9/2007 | Fukuzumi |
| 7,326,982 B2 | 2/2008 | Iwata et al. |
| 7,394,248 B1 | 7/2008 | Guo et al. |
| 7,518,907 B2 | 4/2009 | Nakayama et al. |
| 7,592,189 B2 | 9/2009 | Iwata et al. |
| 2002/0080645 A1* | 6/2002 | Liu .................. H10N 50/10 365/158 |
| 2005/0242384 A1* | 11/2005 | Iwata ................ H10B 61/22 257/E27.005 |
| 2005/0263808 A1 | 12/2005 | Morita |
| 2007/0178609 A1 | 8/2007 | Yoda |
| 2008/0258721 A1 | 10/2008 | Guo et al. |
| 2009/0161267 A1 | 6/2009 | Kawai et al. |
| 2009/0256552 A1* | 10/2009 | Guo .................. G01B 7/30 324/207.21 |
| 2009/0284254 A1 | 11/2009 | Kasajima |
| 2013/0299930 A1 | 11/2013 | Paci et al. |
| 2013/0300409 A1 | 11/2013 | Deak et al. |
| 2014/0021571 A1* | 1/2014 | Lei ................... G01B 7/30 257/427 |
| 2014/0035570 A1 | 2/2014 | Jin et al. |
| 2015/0115939 A1 | 4/2015 | Abe et al. |
| 2015/0145504 A1 | 5/2015 | Bai et al. |
| 2015/0192432 A1 | 7/2015 | Noguchi et al. |
| 2016/0109535 A1 | 4/2016 | Deak |
| 2016/0169987 A1 | 6/2016 | Deak et al. |
| 2018/0123024 A1* | 5/2018 | Sasaki ............... H10N 52/80 |
| 2018/0172782 A1 | 6/2018 | Nagata et al. |

FOREIGN PATENT DOCUMENTS

| | | |
|---|---|---|
| JP | 3069758 U | 6/2000 |
| JP | 2004-146614 A | 5/2004 |
| JP | 2005-064075 A | 3/2005 |
| JP | 2005-317739 A | 11/2005 |
| JP | 2005-353789 A | 12/2005 |
| JP | 2007-207778 A | 8/2007 |
| JP | 2008-268219 A | 11/2008 |
| JP | 4580211 B2 | 11/2010 |
| JP | 2013-210335 A | 10/2013 |
| WO | 02/09025 A1 | 1/2002 |

OTHER PUBLICATIONS

"Ellipse," Wikipedia, Retrieved on Sep. 17, 2022, pp. 1-34, https://de.wikipedia.org/w/index.php?title=Ellipse&oldid=224135063.

"Rhombus," Wikipedia, Retrieved on Sep. 25, 2022, pp. 1-7, https:/en.wikipedia.org/w/index.php?title=Rhombus&oldid=1112086357.

Office Action dated Sep. 26, 2022 issued in corresponding German Patent Application No. 10 2018 127 556.0.

* cited by examiner

MAGNETIC SENSOR WITH AN ELONGATED ELEMENT

CROSS REFERENCE TO RELATED APPLICATIONS

The present application is a continuation application of U.S. Utility application Ser. No. 17/171,560 filed on Feb. 9, 2021, which is a continuation application of U.S. Utility application Ser. No. 16/182,744 filed on Nov. 7, 2018, now U.S. Pat. No. 10,948,316 issued on Mar. 16, 2021, which is based on, and claims priority from, Japanese Application No. 2017-216489, filed on Nov. 9, 2017, the disclosures of which are hereby incorporated by reference.

BACKGROUND OF THE INVENTION

Field of the Invention

The present invention relates to a magnetic sensor.

Description of the Related Art

As a sensor for detecting the position of a moving object, a magnetic sensor that has an element having a magnetoresistive effect is known (see JPH11-87804). A magnetic sensor moves relative to a magnet and thereby detects a change in an external magnetic field that is generated by the magnet, and calculates the moving distance of the moving object based on the change in the external magnetic field that is detected.

The magnetic sensor disclosed in JPH11-87804 has a giant magnetoresistive thin film having magnetoresistive effect and a pair of soft magnetic thin films, as disclosed in FIG. 1. The giant magnetoresistive thin film of this magnetic sensor is elongate, and the soft magnetic thin films are arranged on both sides of the giant magnetoresistive thin film with regard to the direction of the short sides thereof. The giant magnetoresistive thin film is rectangular, as viewed in the film thickness direction thereof. In this magnetic sensor, the soft magnetic thin films that are arranged on both sides of the giant magnetoresistive thin film improves the performance of shielding a magnetic field in directions other than a magnetically sensitive axis of the giant magnetoresistive thin film in order to enhance the sensitivity in the direction of the magnetically sensitive axis.

SUMMARY OF THE INVENTION

An output of a magnetic sensor has hysteresis. An output at a certain strength of an external magnetic field that is increasing does not coincides with an output at the certain strength of an external magnetic field that is decreasing, and hysteresis is a difference between the former and the latter. Large hysteresis worsens the precision of a magnetic sensor.

The present invention aims at providing a magnetic sensor that is capable of reducing hysteresis.

The magnetic sensor of the invention comprises an element portion that is elongate, that exhibits a magnetoresistive effect and that has a magnetically sensitive axis in a direction of a short axis thereof. The element portion is non-oval and can be arranged in an imaginary ellipse, wherein the imaginary ellipse has a major axis that connects both ends of the element portion with regard to a direction of a long axis thereof to each other and a minor axis that connects both ends of the element portion with regard to a direction of the short axis thereof to each other, as viewed in a direction that is perpendicular both to the short axis and to the long axis of the element portion.

According to the present invention, a magnetic sensor is provided that is capable of reducing hysteresis.

The above and other objects, features and advantages of the present invention will become apparent from the following descriptions with reference to the accompanying drawings which illustrate examples of the present invention.

DETAILED DESCRIPTION OF EMBODIMENTS

Explanation will be given about the first and second embodiments, as well as modifications of the embodiments. In the following descriptions, both ends 22A, 22B and middle position 24 of element portion 20 (or 20B to 20I) are defined with regard to the direction of long axis LA of element portion 20 (or 20B to 20I). Therefore, both ends 22A, 22B of element portion 20 (or 20B to 20I) mean both ends 22A, 22B of element portion 20 (or 20B to 20I) with regard to the direction of long axis LA of element portion 20 (or 20B to 20I), and middle position 24 of element portion 20 (or 20B to 20I) means middle position 24 of element portion 20 (or 20B to 20I) with regard to the direction of long axis LA of element portion 20 (or 20B to 20I). Similarly, both ends 26A, 26B and the width of element portion 20 (or 20B to 20I) are defined with regard to the direction of short axis SA of element portion 20 (or 20B to 20I). Therefore, both ends 26A, 26B of element portion 20 (or 20B to 20I) mean both ends 26A, 26B of element portion 20 (or 20B to 20I) with regard to the direction of short axis SA of element portion 20 (or 20B to 20I), and the width of element portion 20 (or 20B to 20I) means the width of element portion 20 (or 20B to 20I) with regard to the direction of short axis SA of element portion 20 (or 20B to 20I).

First Embodiment

Figure 1A:
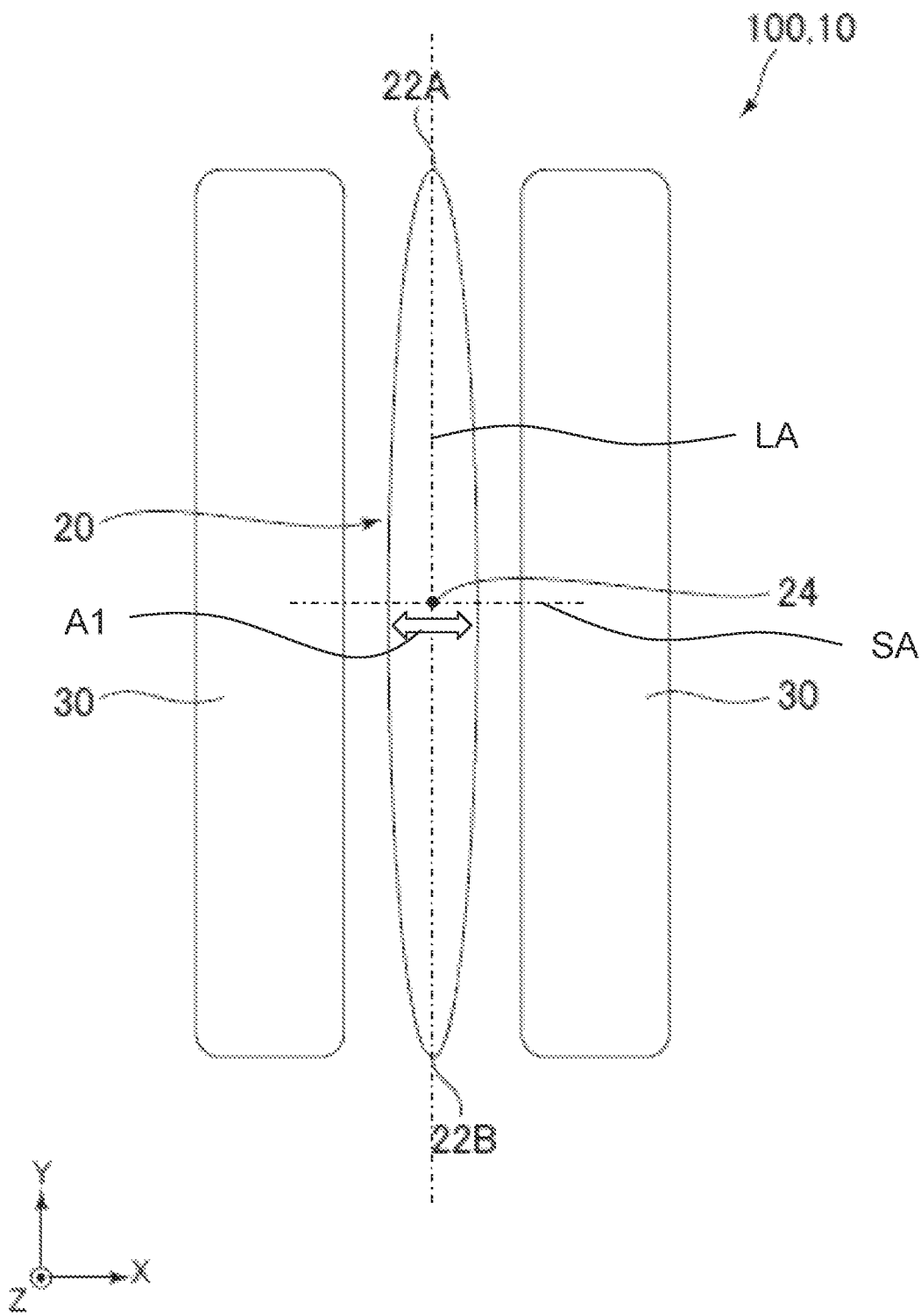
FIG. 1A is a plan view of the main portion of a magnetic sensor according to a first embodiment.

Magnetic sensor 10 of the present embodiment is, for example, a sensor for detecting the position of a moving object (not shown) having a magnet, that is, a positon sensor. Magnetic sensor 10 of the present embodiment is configured to move relative to the above-mentioned magnet and thereby to detect a change in an external magnetic field that is generated by the magnet, and to calculate the moving distance of the moving object based on the change in the external magnetic field that is detected. Magnetic sensor 10 of the present embodiment has magnetoresistive element portion 100 that is constructed by element portion 20 and soft magnetic bodies 30, as shown in FIG. 1A. Element portion 20 has magnetically sensitive axis A1, which is directed in the direction of short axis SA of element portion 20, and magnetic sensor 10 detects a change in a magnetic field in the direction of short axis SA that is generated by the moving object.

In the following descriptions, the X axis is an axis that is parallel to short axis SA of element portion 20 and the short axis of soft magnetic bodies 30, and the Y axis is an axis that is parallel to long axis LA of element portion 20 and the long axis of soft magnetic bodies 30 in FIG. 1A. The Z axis is an axis that is perpendicular both to the X axis and to the Y axis.

Figure 1B:
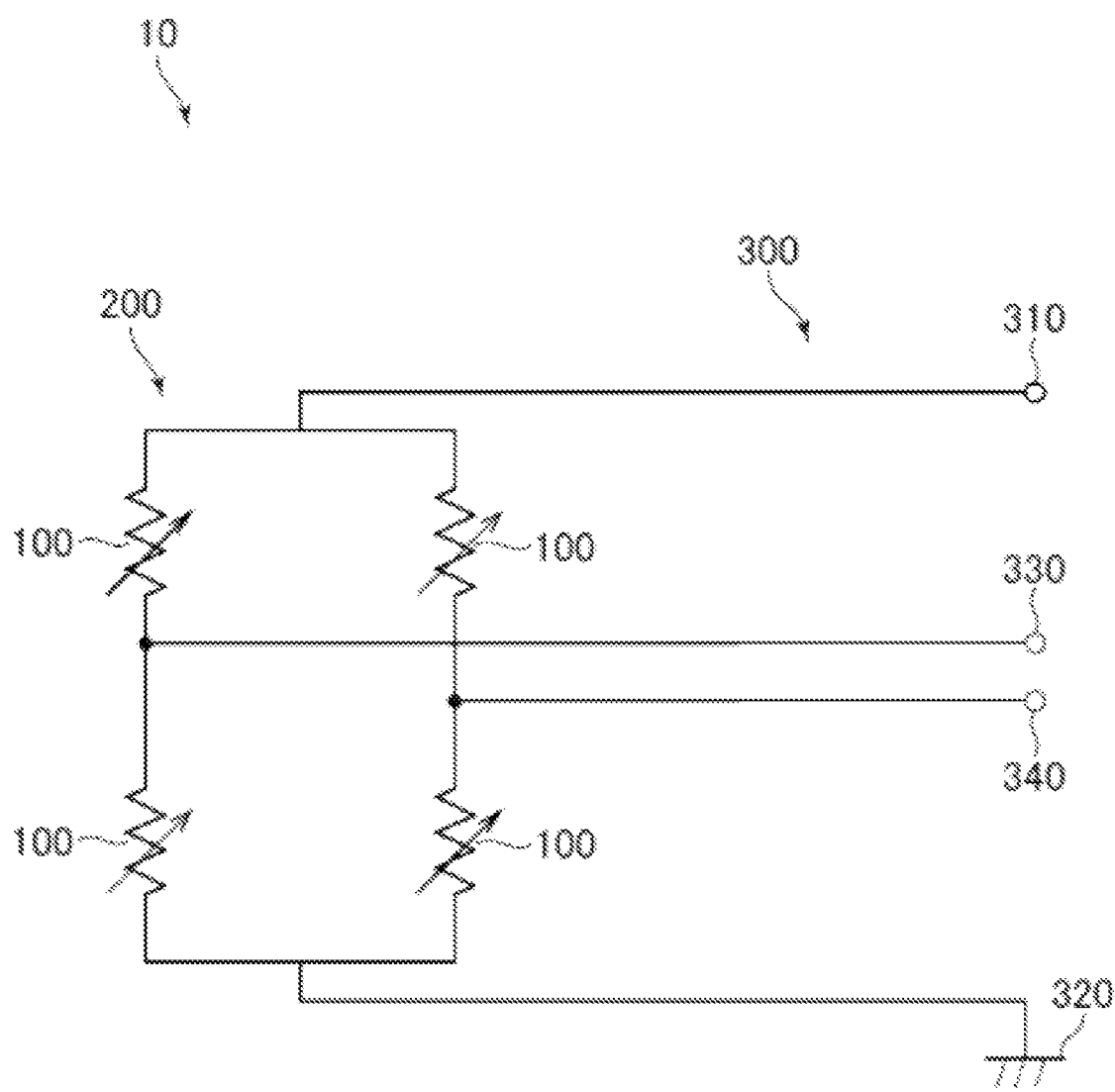
FIG. 1B is a circuit diagram of the magnetic sensor according to the first embodiment.

As shown in FIG. 1B, magnetic sensor 10 of the present embodiment has sensor portion 200, in which magnetoresistive element portions 100 are bridge-connected to each other, and integrated circuit 300 having input terminal 310 that is electrically connected to sensor portion 200, ground terminal 320 and external output terminals 330, 340 etc.

Element portion 20 of the present embodiment is elongate and is arranged such that long axis LA is in parallel to the Y axis, as shown in FIGS. 1A and 1O. Element portion 20 is formed of a material that exhibits magnetoresistive effect, as described later.

As shown in FIG. 1O, element portion 20 is shaped such that element portion 20 can be arranged in imaginary ellipse EP having a major axis, which is line L1 that connects end 22A to end 22B, and a minor axis, which is line L2 that connects end 26A to end 26B at middle position 24, as viewed in the film thickness direction, that is, in the Z axis direction. Circumference C1 of element portion 20 is apart from the circumference of imaginary ellipse EP except for both ends 22A, 22B and both ends 26A, 26B. This means that element portion 20 is non-oval, as viewed in the film thickness direction. In the present description, the film thickness direction of element portion 20, that is, the Z axis direction, corresponds to a direction that is perpendicular both to the direction of long axis LA and to the direction of short axis SA of element portion 20.

Figure 1C:
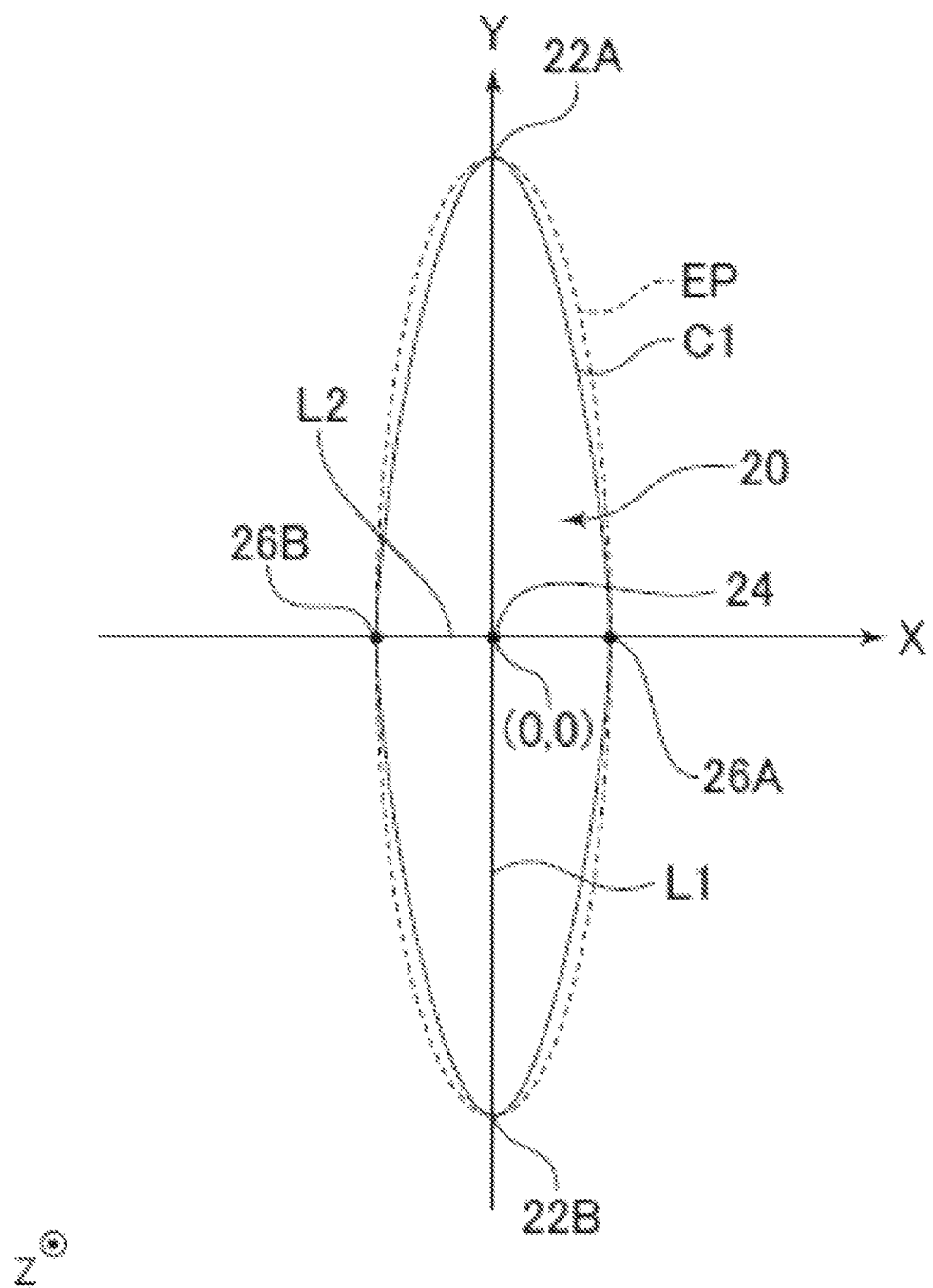
FIG. 1O is a diagram showing a relationship between an element portion that constitutes the magnetic sensor of the first embodiment and an imaginary ellipse on an XY coordinate system.
FIG. 1D is a sectional view of an element portion that constitutes the main portion of the magnetic sensor according to the first embodiment.

The width of element portion 20 gradually decreases from middle position 24 toward both ends 22A, 22B, as shown in FIG. 1C.

As shown in FIG. 1O, element portion 20 is in line symmetry with regard to the major axis of imaginary ellipse EP (the Y axis in FIG. 1O) and in line symmetry with regard to the minor axis of imaginary ellipse EP (the X axis in FIG. 1O), as viewed in the film thickness direction.

It should be noted that middle position 24 is, for example, set to be Y=0 in the XY coordinate system in FIG. 1C.

Figure 1D:
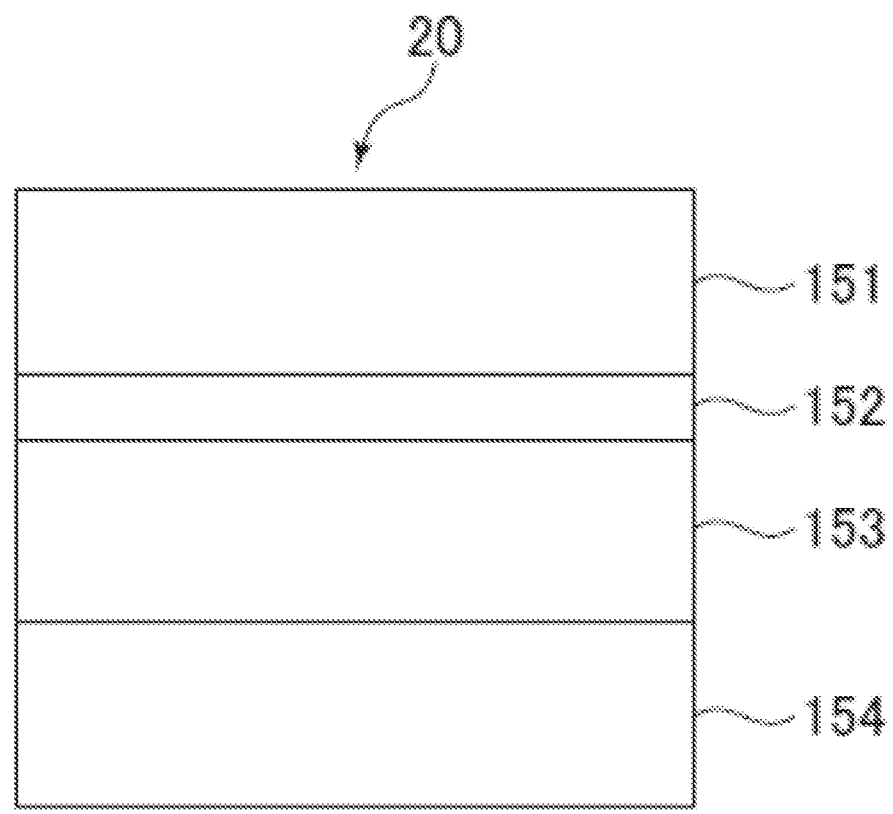
Figure 1D:
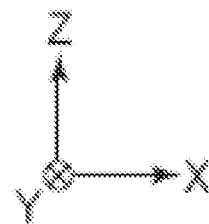

Each element portion 20 has, for example, a typical spin-valve type film configuration, as shown in FIG. 1D. Specifically, element portion 20 includes free layer 151 whose magnetization direction is changed depending on an external magnetic field, pinned layer 153 whose magnetization direction is pinned relative to the external magnetic field, spacer layer 152 that is positioned between and that is in contact both with free layer 151 and with pinned layer 153 and antiferromagnetic layer 154 that is adjacent to pinned layer 153 on the back side thereof as seen from spacer layer 152. Free layer 151, spacer layer 152, pinned layer 153 and antiferromagnetic layer 154 are stacked above a substrate (not shown). Antiferromagnetic layer 154 fixes the magnetization direction of pinned layer 153 by the exchange coupling with pinned layer 153. Pinned layer 153 may also have a synthetic structure in which two ferromagnetic layers sandwich a nonmagnetic intermediate layer. Spacer layer 152 is a tunneling barrier layer that is formed of a nonmagnetic insulator, such as $Al_2O_3$. Accordingly, element portion 20 of the present embodiment functions as a tunneling magnetoresistive element (a TMR element). In other words, element portion 20 of the present embodiment has a tunneling magnetoresistive effect. A TMR element has a larger MR ratio and a larger output voltage from the bridge circuit than, for example, a GMR (giant magnetoresistive) element.

In the present embodiment, a pair of soft magnetic bodies 30 is provided, and soft magnetic bodies 30 are arranged near and on both sides of element portion 20 with regard to the direction of short axis SA thereof and sandwiches element portion 20 therebetween, as shown in FIG. 1A. Each soft magnetic body 30 is elongate and is arranged such that the direction of the long axis thereof is in parallel to the direction of long axis LA of element portion 20, as viewed in the film thickness direction of element portion 20. Soft magnetic bodies 30 of the present embodiment have a function as a shield (a function of absorbing an external magnetic field in the direction of short axis SA and prevents the external magnetic field from being applied to element portion 20). Soft magnetic bodies 30 are formed, for example, of NiFe, CoFe, CoFeSiB, CoZrNb and the like.

Next, the effect of the present embodiment will be described by comparing the present embodiment (see FIGS. 1A and 1B) to a comparative example (see FIG. 2A). When the same elements are used in the comparative example as in the present embodiment, the names and reference numerals in the present embodiment will be used.

COMPARATIVE EXAMPLE

Figure 2A:
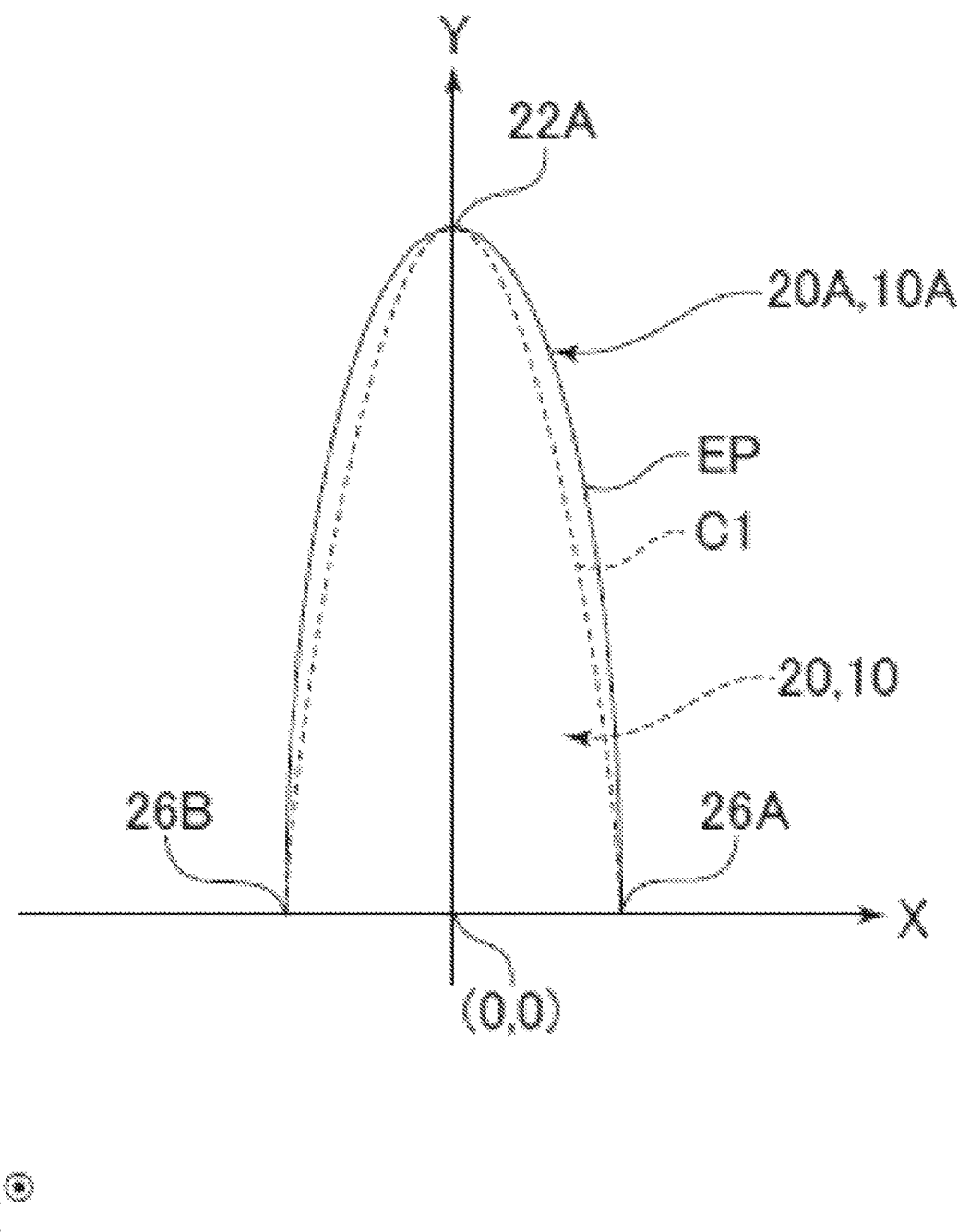
FIG. 2A is a diagram showing a relationship between an element portion that constitutes a magnetic sensor of a comparative example and an imaginary ellipse on an XY coordinate system.

Magnetic sensor 10A of the comparative example has element portion 20A having the same shape as imaginary ellipse EP shown in FIG. 1B, as viewed in the film thickness direction (see FIG. 2A). Magnetic sensor 10A of the comparative example has the same configuration as magnetic sensor 10 of the present embodiment except for the above. In FIG. 2A, only a part of element portion 20A of the comparative example and a part of element portion 20 of the present embodiment (the first and second quadrants on the XY coordinate system) are illustrated and the rest is omitted.

Figure 2B:
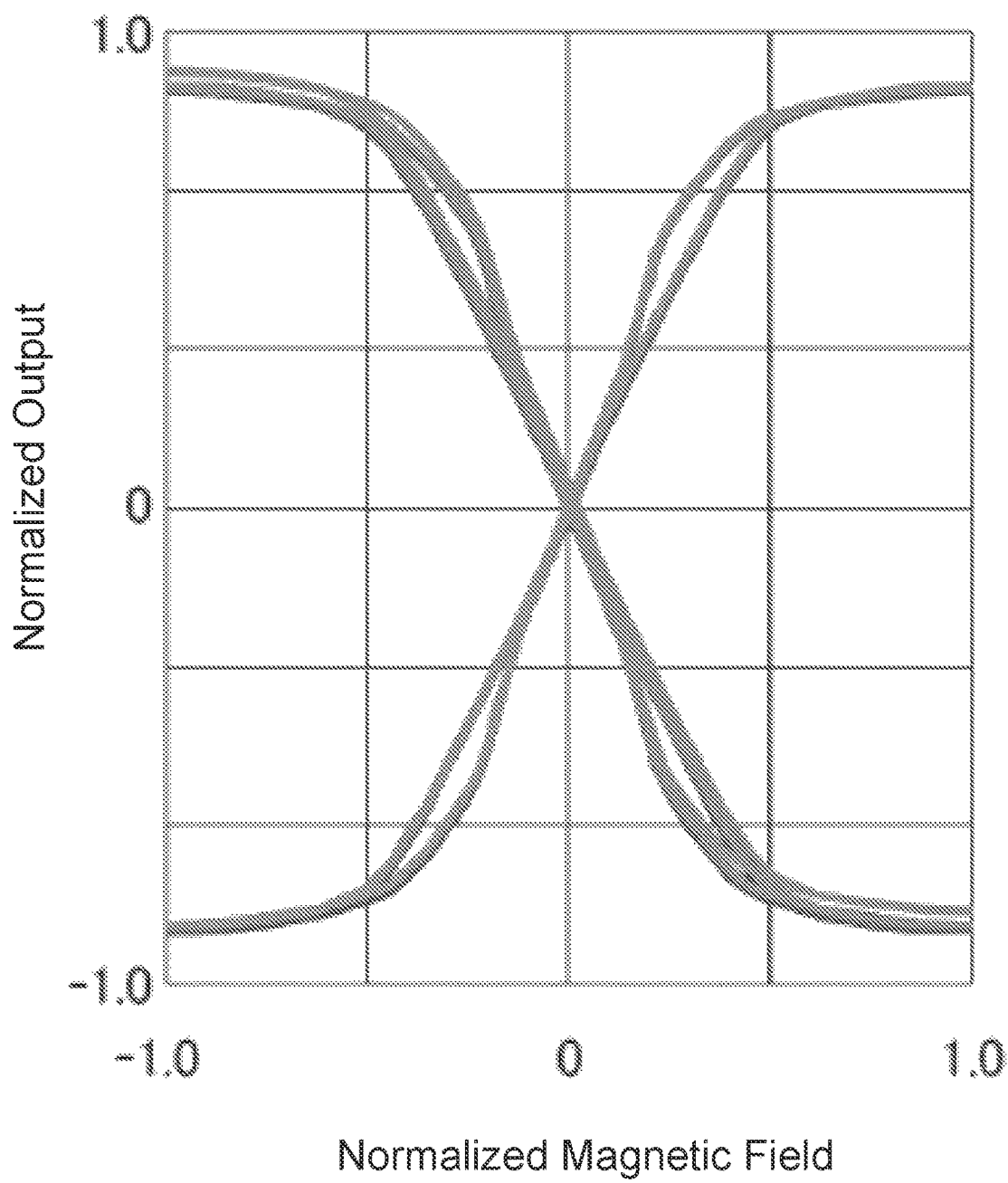
FIG. 2B is a hysteresis curve of the comparative example.
Figure 3:
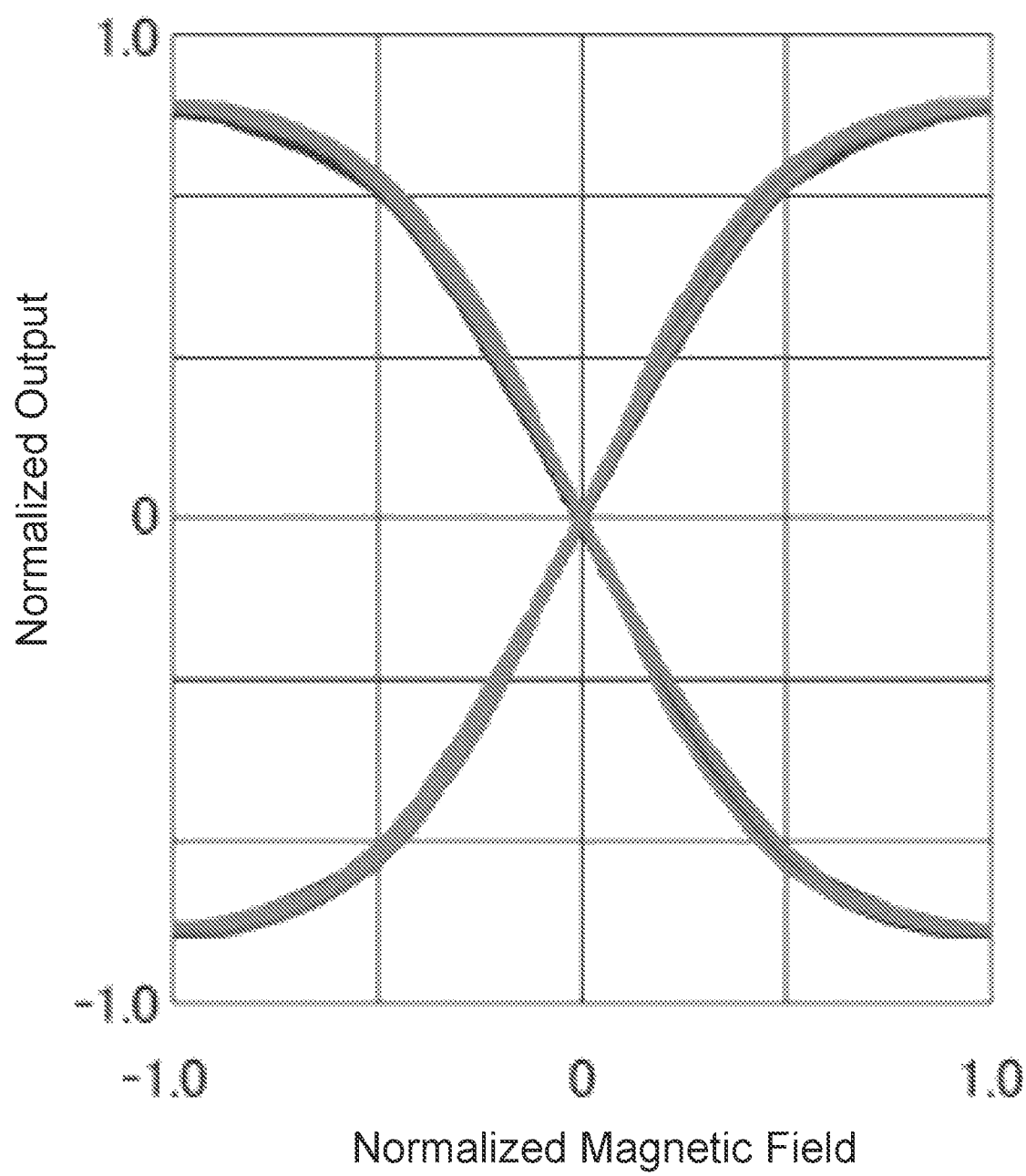
FIG. 3 is a hysteresis curve of the first embodiment.

FIG. 2B shows a hysteresis curve that was measured by means of magnetic sensor 10A of the comparative example. FIG. 3 shows a hysteresis curve that was measured by means of magnetic sensor 10 of the present embodiment. Comparing FIG. 2B to FIG. 3, it is found that the present embodiment shows a smaller difference of output on the hysteresis curve than the comparative example. In FIGS. 2B and 3, the horizontal axis is a normalized magnetic field and the vertical axis is a normalized output.

The inventor thinks the reason is as follows. As shown in FIGS. 1B and 2A, element portion 20A of the comparative example is oval and swells outward of circumference C1 of element portion 20 of the present embodiment (the swelling portion is between broken line C1 and real line EP in FIG. 2A). In other words, in element portion 20 of the present embodiment, both ends 22A, 22B and both ends 26A, 26B coincide with both ends of the major axis and both ends of the minor axis of element portion 20A of the comparative example, respectively, and circumference C1 other than both ends 22A, 22B and both ends 26A, 26B is arranged inside of the circumference of the element portion 20A. Thus, element portion 20 of the present embodiment is formed into a non-oval shape that overlaps with imaginary ellipse EP at both ends of the major axis and both ends of the minor axis of imaginary ellipse EP and that is arranged in imaginary ellipse EP.

Therefore, the width of element portion 20 of the present embodiment is smaller than that of element portion 20A of the comparative example between middle position 24 and both ends 22A, 22B. As a result, in element portion 20 of the present embodiment, unstable magnetic field component that is directed outward from inside with regard to the direction of short axis SA is less likely to occur near both ends 22A, 22B of element portion 20, as compared to element portion 20A of the comparative example.

Accordingly, magnetic sensor 10 of the present embodiment is capable of reducing the difference of output on the hysteresis curve, as compared to the comparative example. In other words, magnetic sensor 10 of the present embodiment is capable of reducing hysteresis, as compared to the comparative example. As a result, the output of magnetic sensor 10 of the present embodiment is more precise than the output of the comparative example.

In the present embodiment, the width of the element portion 20 is smaller than that of imaginary ellipse EP between middle position 24 and both ends 22A, 22B, as mentioned above, and in addition, the width gradually decreases in the direction of long axis LA as the distance from middle position 24 in the direction of long axis LA increases. This means that the above-mentioned effect can be easily obtained due to the shape of the element portion 20 of the present embodiment.

In addition, the width of element portion 20 of the present embodiment is not changed at a constant rate, but is changed at a rate that gradually increases in the direction of long axis LA as the distance from middle position 24 in the direction of long axis LA increases. This also means that the above-mentioned effect can be easily obtained due to the shape of the element portion 20 of the present embodiment.

Second Embodiment

Figure 4A:
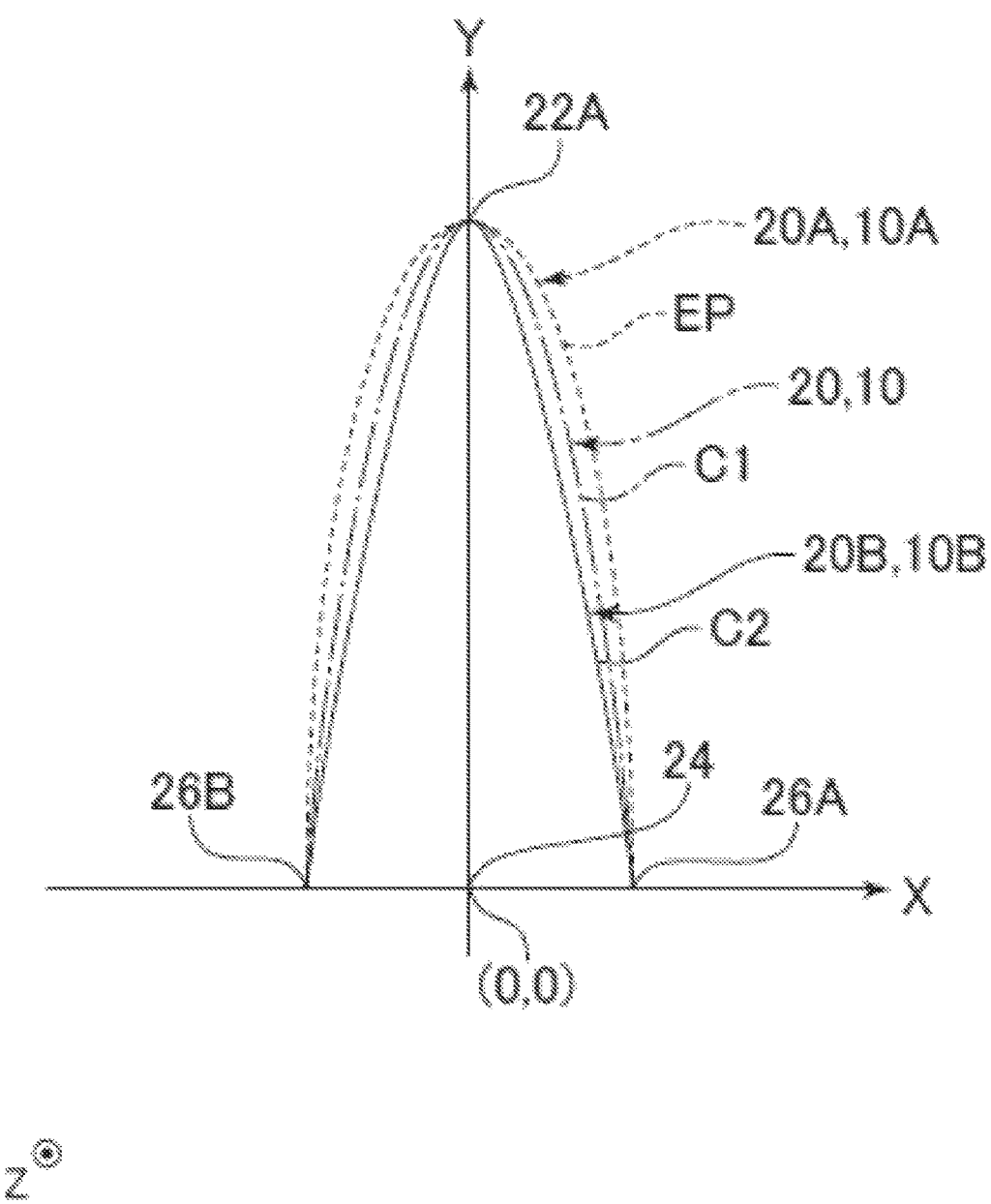
FIG. 4A is a diagram showing a relationship between an element portion that constitutes a magnetic sensor of a second embodiment and an imaginary ellipse on an XY coordinate system.
Figure 4B:
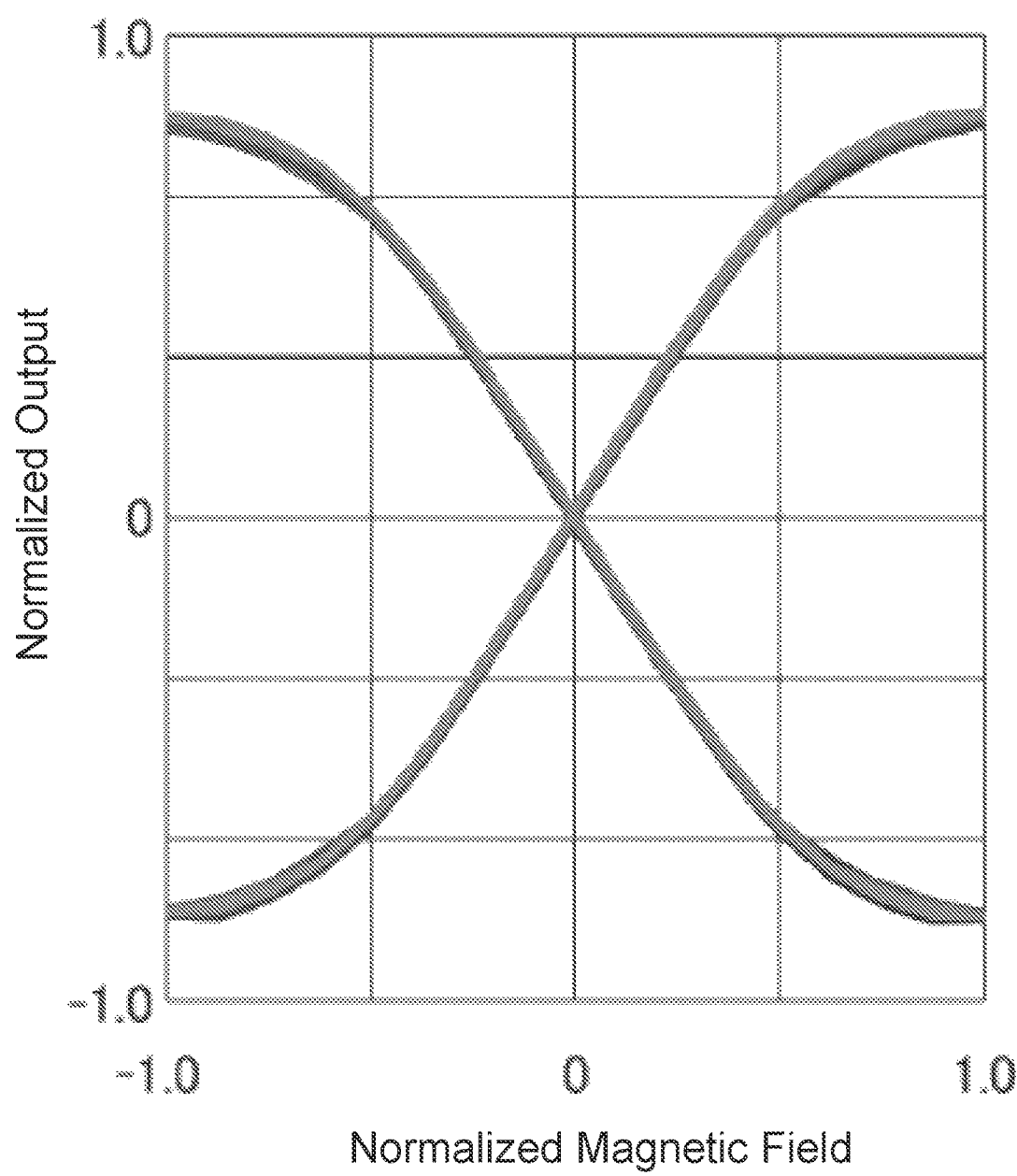
FIG. 4B is a hysteresis curve of the second embodiment.

Next, referring to FIGS. 4A and 4B, explanation will be given about magnetic sensor 10B of the second embodiment. FIG. 4A is a diagram showing a relationship between element portion 20B of magnetic sensor 10B of the present embodiment, imaginary ellipse EP (element portion 20A of the comparative example) and element portion 20 of the first embodiment on an XY coordinate system. In FIG. 4A, real line C2 shows the circumference of element portion 20B of the present embodiment. FIG. 4B shows a hysteresis curve that was measured by means of magnetic sensor 10B of the present embodiment. In FIG. 4B, the horizontal axis is a normalized magnetic field and the vertical axis is a normalized output.

In magnetic sensor 10B of the present embodiment, in the same manner as the first embodiment, both ends 22A, 22B of element portion 20B and both ends 26A, 26B overlap with both ends of the major axis and both ends of the minor axis of imaginary ellipse EP, respectively, as viewed in the film thickness direction (see FIG. 4A). Magnetic sensor 10B of the present embodiment is formed into a non-oval shape that is arranged inside of imaginary ellipse EP, as shown in FIG. 4A. In element portion 20B of the present embodiment, the width is smaller than that of the first embodiment along the entire range between middle position 24 and both ends 22A, 22B, as shown in FIG. 4A. However, in the same manner as the first embodiment, the width of element portion 20B of the present embodiment is changed at a rate that gradually increases in the direction of long axis LA as the distance from middle position 24 in the direction of long axis LA increases. The present embodiment has the same configuration as the first embodiment except for the above. It should be noted that in FIG. 4A, only a part of imaginary ellipse EP, a part of element portion 20 of the first embodiment and a part of element portion 20B of the present embodiment (the first and second quadrants in the XY coordinate system) are illustrated and the rest is omitted.

FIG. 4B shows a hysteresis curve that was measured by means of magnetic sensor 10B of the present embodiment. In FIG. 4B, the horizontal axis is a normalized magnetic field and the vertical axis is a normalized output. Comparing FIG. 2B (the comparative example) to FIG. 4B (the present embodiment), it is found that the present embodiment shows a smaller difference of output on the hysteresis curve than the comparative example. The reason is believed to be the same as the reason that is described in the comparison between the first embodiment and the comparative example, mentioned above.

Comparing FIG. 4B (the measurement of the present embodiment) to FIG. 3 (the measurement of the first embodiment), it is found that the present embodiment shows a smaller difference of output on the hysteresis curve than the first embodiment. In other words, the effect that is described in the first embodiment is can be more effectively obtained by adopting an arrangement having the above-mentioned effect and by setting the width to be smaller than the width of the first embodiment along the entire range between middle position 24 and both ends 22A, 22B. Here, the arrangement having the above-mentioned effect that is described in the first embodiment is an arrangement in which the entire circumference C2 of element portion 20B is arranged inside of circumference C1 of element portion 20 the first embodiment except for both ends 22A, 22B and both ends 26A, 26B, as viewed in the film thickness direction.

The invention has been described by using the first and second embodiments, but the scope of the invention is not limited to these embodiments. The scope of the invention includes, for example, the following embodiments (modifications).

Figure 5A:
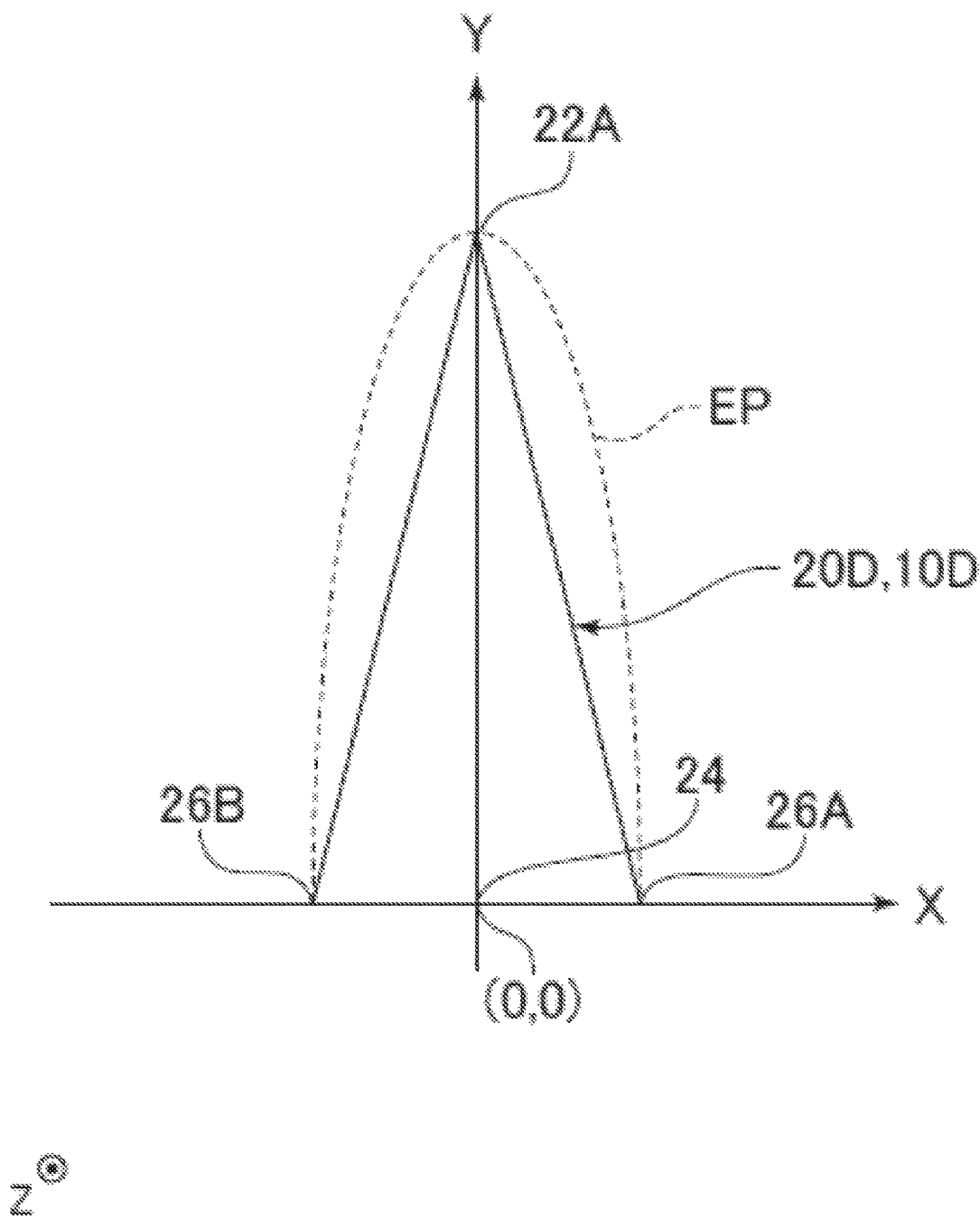
FIGS. 5A to 5F are diagrams showing a relationship between an element portion that constitutes a magnetic sensor of the first to sixth modifications and an imaginary ellipse on an XY coordinate system, respectively.

In each embodiment, the width of element portion 20, 20B is changed at a rate that gradually increases in the direction of long axis LA as the distance from middle position 24 in the direction of long axis LA increases (see FIGS. 1C, 2A and 4A). However, as shown in FIG. 5A that illustrates magnetic sensor 10D (element portion 20D) according to the first modification, as long as the width of the element portion gradually decreases as the distance from middle position 24 in the direction of long axis LA increases, the rate of a change in the width may be constant.

Figure 5B:
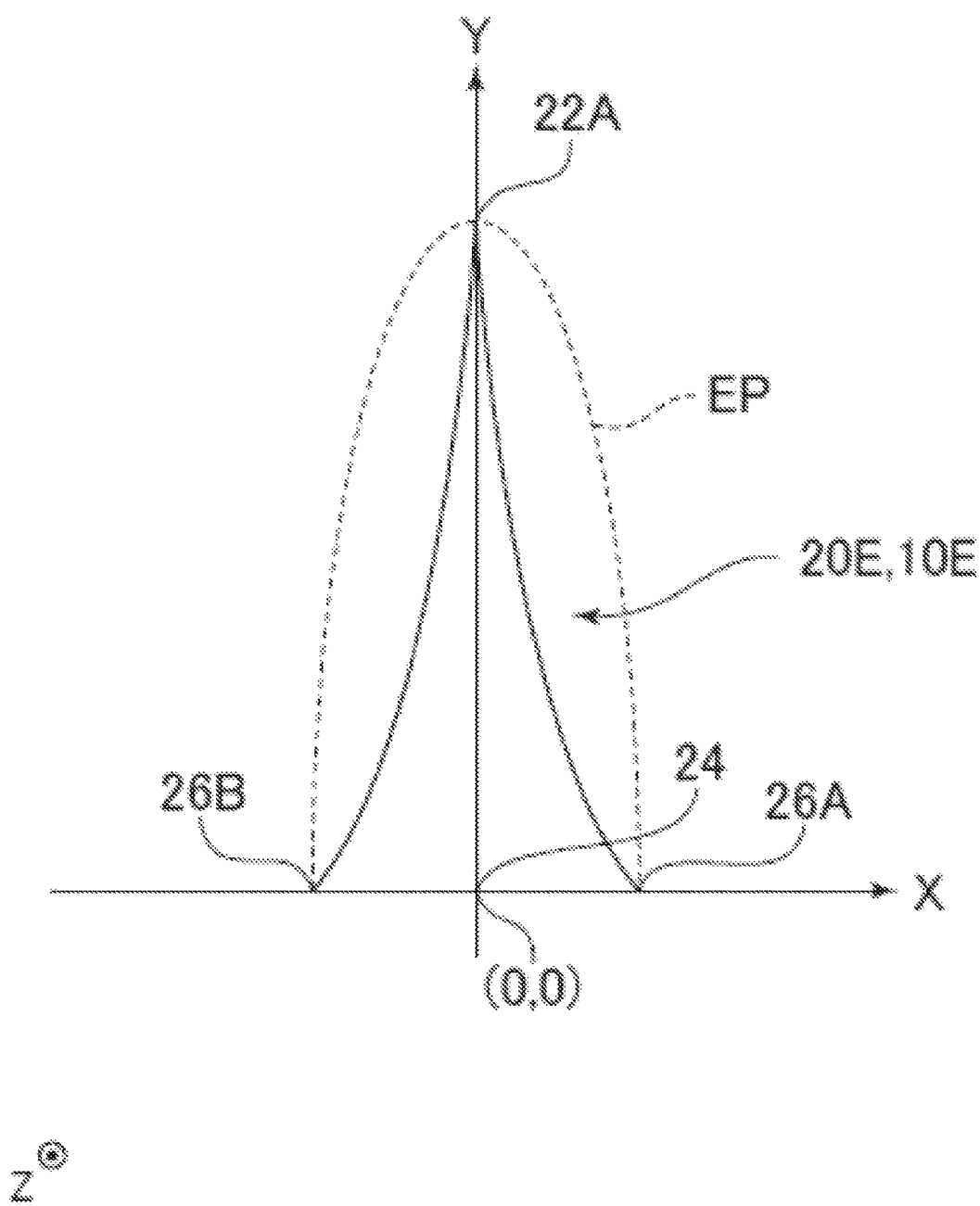

Further, as shown in FIG. 5B that illustrates magnetic sensor 10E (element portion 20E) according to the second modification, as long as the width of the element portion gradually decreases as the distance from middle position 24 in the direction of long axis LA increases, the rate of a change in the width may gradually decrease as the distance from middle position 24 in the direction of long axis LA increases.

Figure 5C:
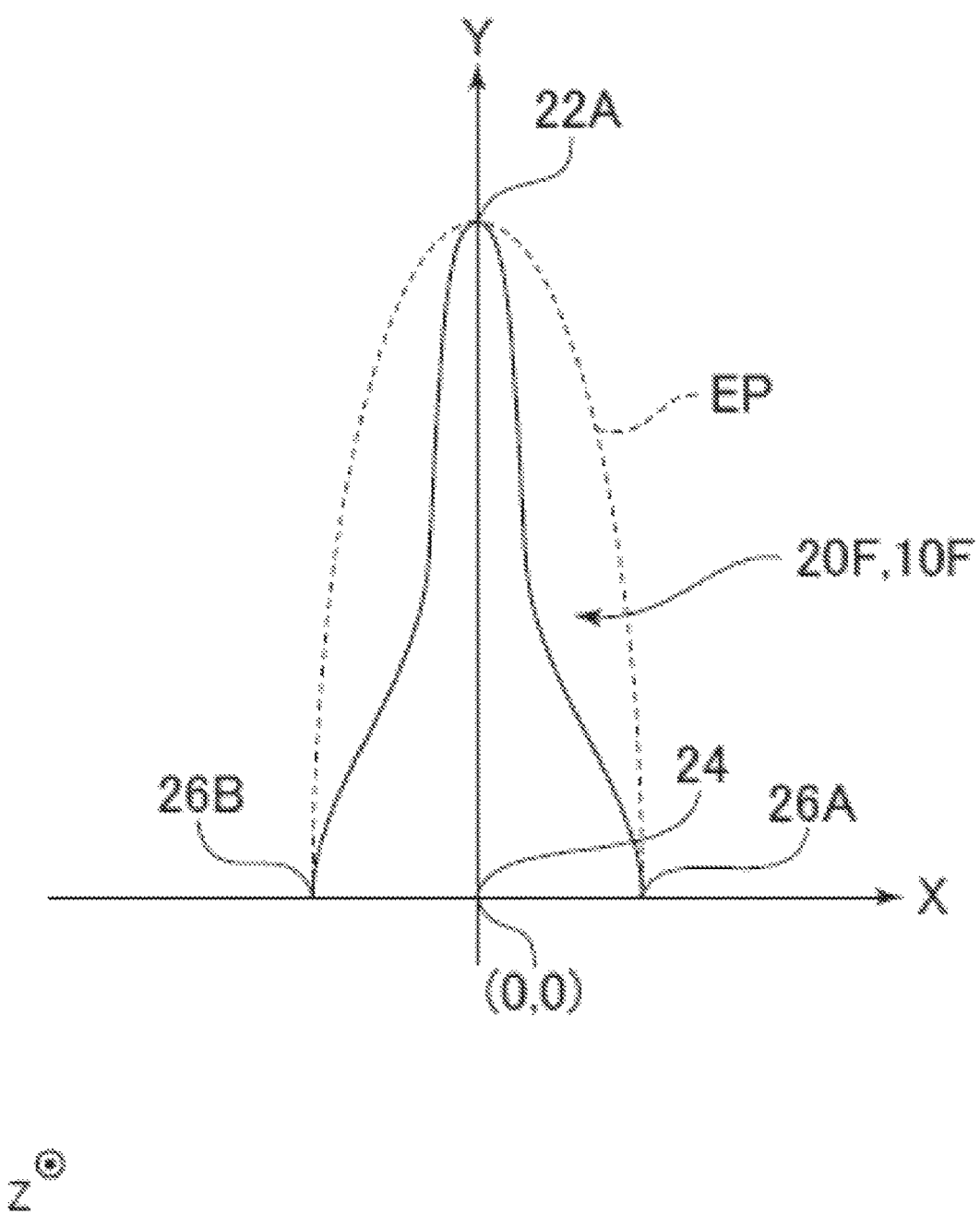
Figure 5D:
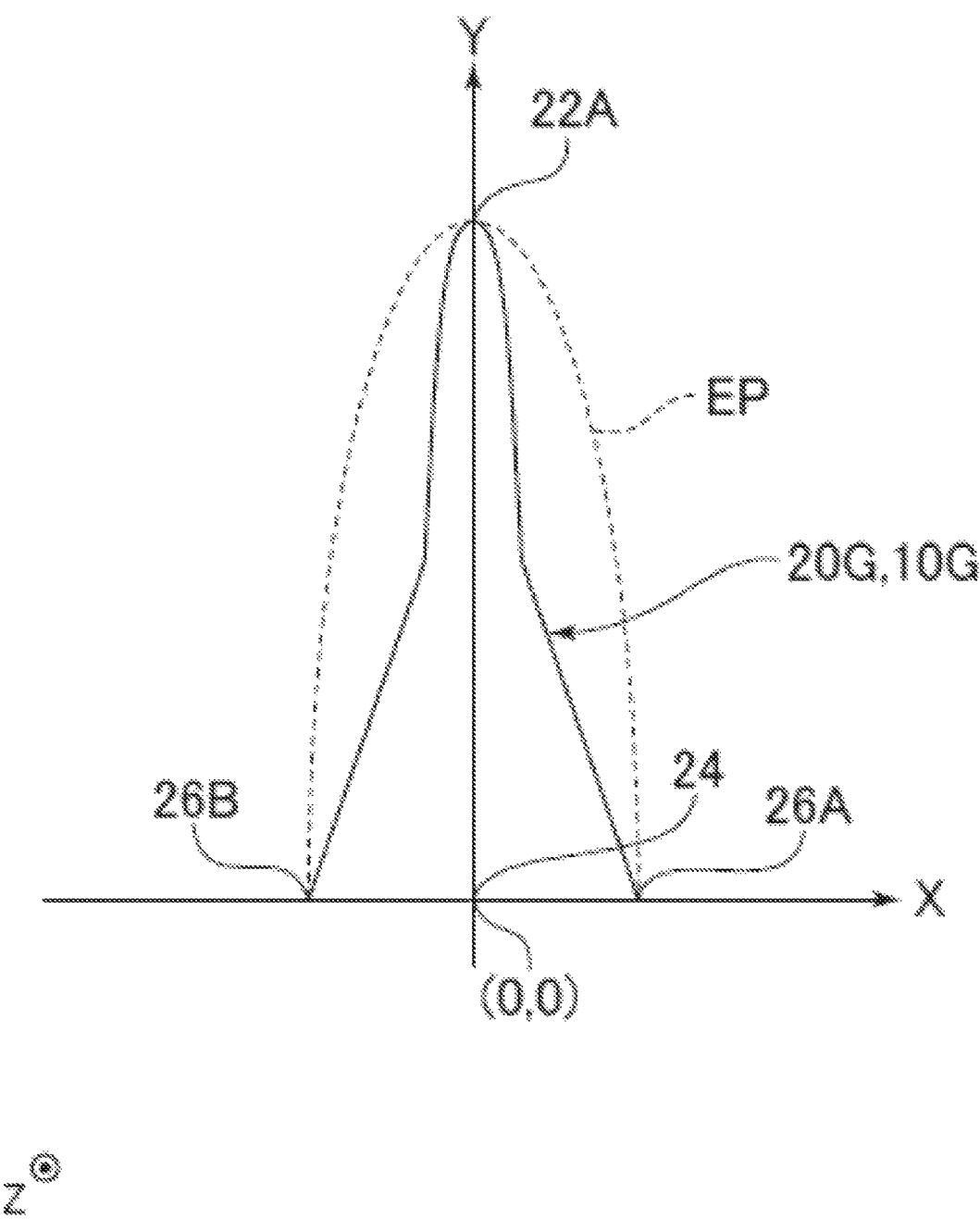

Further, as shown in FIG. 5C that illustrates magnetic sensor 10F (element portion 20F) according to the third modification, as long as the width of the element portion gradually decreases as the distance from middle position 24 in the direction of long axis LA increases, the rate of a change in the width may be changed along a range between middle position 24 and both ends 22A, 22B. In addition, as shown in FIG. 5D that illustrates magnetic sensor 10G (element portion 20G) according to the fourth modification, the rate of a change in the width may be constant from middle position 24 to halfway between middle position 24 and both ends 22A, 22B and may be changed from halfway between middle position 24 and both ends 22A, 22B to both ends 22A, 22B.

It should be noted that the illustration of the third and fourth quadrants of element portions 20D to 20G is omitted in FIGS. 5A to 5D, but the third and fourth quadrants are in line symmetry with the first and second quadrants with regard to the minor axis of imaginary ellipse EP.

Figure 5E:
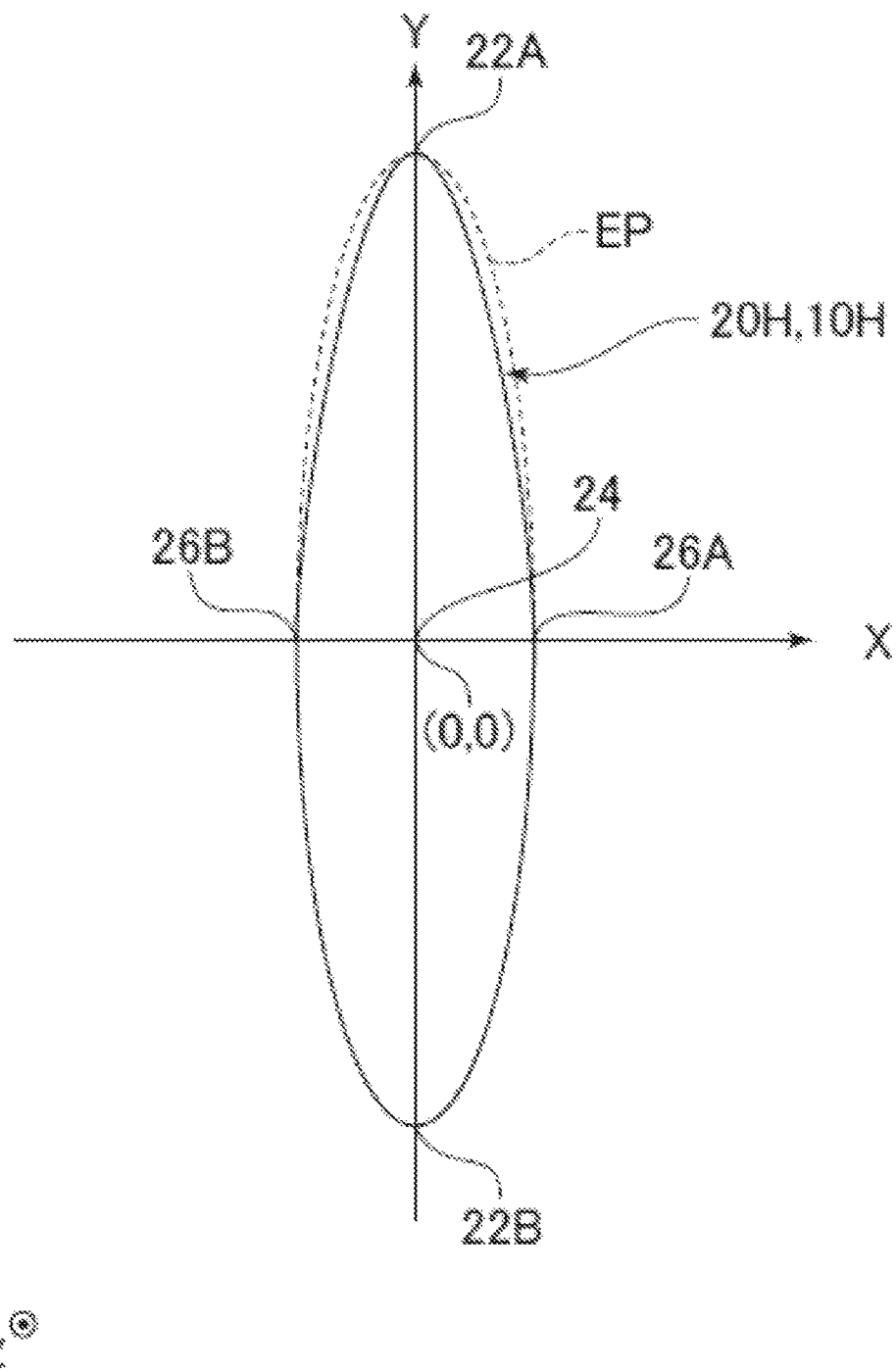

In each embodiment, element portion 20, 20B are in line symmetry with regard to the minor axis of imaginary ellipse EP. However, as shown in FIG. 5E that illustrates magnetic sensor 10H (element portion 20H) according to the fifth modification, as long as the element portion is formed into a non-oval shape that overlaps with imaginary ellipse EP at least at both ends of the major axis of imaginary ellipse EP and at both ends of the minor axis of imaginary ellipse EP and that is arranged inside of imaginary ellipse EP, the element portion does not need to be in line symmetry with regard to the minor axis of imaginary ellipse EP.

Figure 5F:
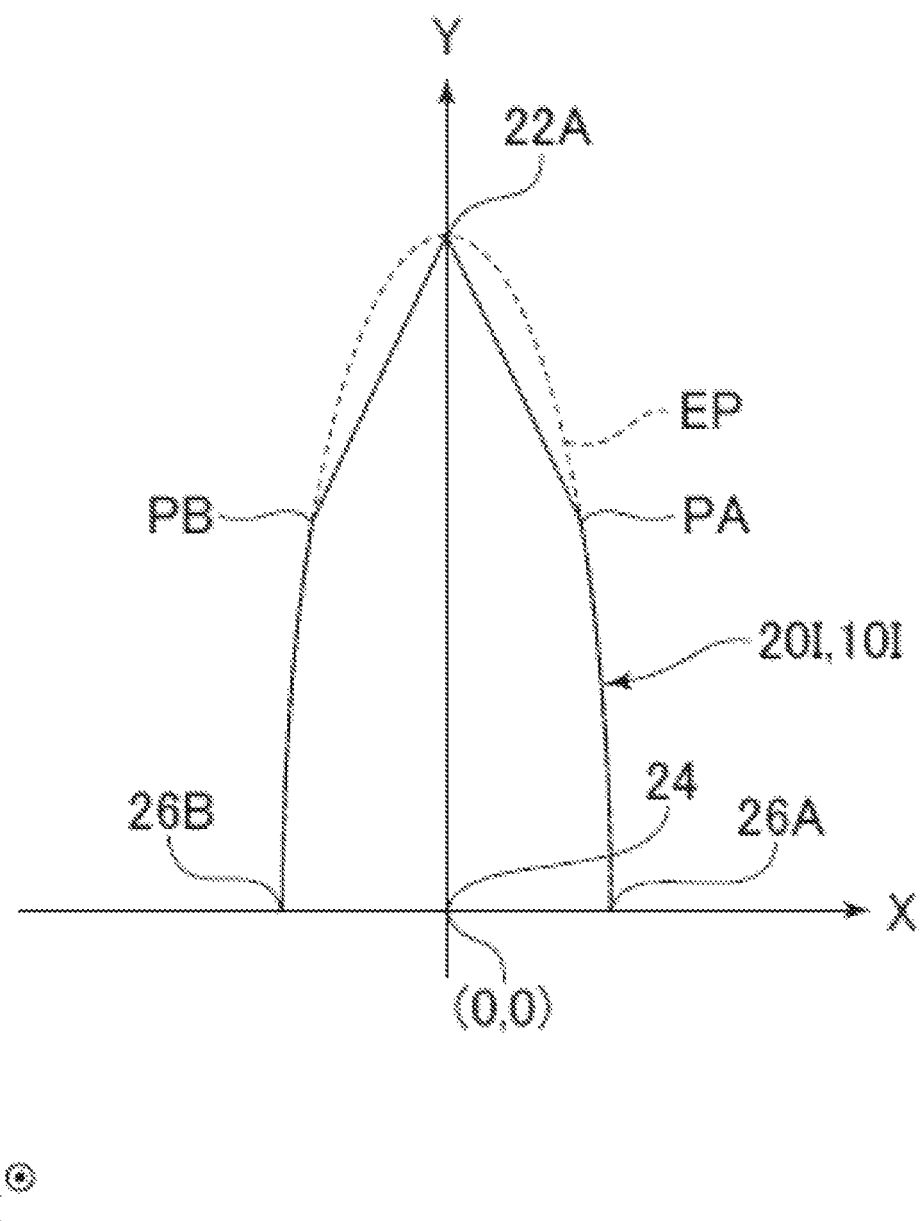

In each embodiment (the first and second embodiments) and in each modification (the first and fourth modifications), mentioned above, the entire circumference of each element portion is arranged inside of the circumference of imaginary ellipse EP except for both ends 22A, 22B and both ends 26A, 26B (see FIGS. 1C, 2A, 5A to 5D). However, as shown in FIG. 5F that illustrates magnetic sensor 10I (element portion 20I) according to the sixth modification, as long as the element portion is formed into a non-oval shape that overlaps with imaginary ellipse EP at least at both ends of the major axis of imaginary ellipse EP and at both ends of the minor axis of imaginary ellipse EP and that is arranged inside of imaginary ellipse EP, as viewed in film thickness direction, curved lines that form a part of the circumference of element portion 20I (a part that extends from end 26A to point PA that is between end 26A and end 22A with regard to the direction of long axis LA, and a part that extends from end 26B to point PB that is between end 26B and end 22A with regard to the direction of long axis LA) may overlap with a part of a curved line that forms the circumference of imaginary ellipse EP. In other words, a part of the circumference of element portion 20I may overlap with a part of the circumference of imaginary ellipse EP, as viewed in the Z axis direction.

It should be noted that, in the sixth modification, the circumference of the element portion other than the part that overlaps with the circumference of imaginary ellipse EP is straight, but may be curved (not shown), as viewed in film thickness direction.

In each embodiment and modification, the spacer layer that constitutes element portion 20 is a tunneling barrier layer, and element portion 20 is a TMR element. However, the spacer layer that constitutes element portion 20 may be a nonmagnetic conductive layer that is formed of a nonmagnetic metal, such as Cu, in order to form element portion 20 as a giant magnetoresistive element (GMR element). Element portion 20 may also be an anisotropic magnetoresistive element (AMR element).

The magnetic sensor of each embodiment and modification has been described by taking a position sensor as an example. However, the magnetic sensor of the embodiments and modifications may be a sensor other than a positon sensor as long as the magnetic sensor detects a magnetic field that is applied in the direction of short axis SA. For example, the magnetic sensor may be an angle sensor, an encoder and so on.

The embodiments and the modifications have been described independently, but an embodiment in which one from among the first and second embodiments and the first to sixth modifications is combined with an element of other embodiments/modifications is also included in the scope of the present invention. For example, in the fifth modification (FIG. 5E), the first and second quadrants of element portion 20H of magnetic sensor 10H on the XY coordinate system may be unchanged and the third and fourth quadrants may be replaced with the third and fourth quadrants of the second modification (FIG. 5C).

Although certain preferred embodiments of the present invention have been shown and described in detail, it should be understood that various changes and modifications may be made without departing from the spirit or scope of the appended claims.

What is claimed is:

1. A magnetic sensor comprising: an element portion that is elongate and that exhibits a magnetoresistive effect;

the element portion is non-oval and is arranged in an imaginary ellipse, wherein the imaginary ellipse has a major axis that connects both ends of the element portion with regard to a direction of a long axis thereof to each other and a minor axis that connects both ends of the element portion with regard to a direction of a short axis thereof to each other, as viewed in a direction that is perpendicular both to the short axis and to the long axis of the element portion, wherein a width of the element portion with regard to the direction of the short axis thereof decreases from a middle position of the element portion with regard to the direction of the long axis thereof toward both ends of the element portion with regard to the direction of the long axis thereof as a distance from the middle position increases, and a rate of a change in the width of the element portion in the direction of the long axis increases from the middle position toward the both ends of the element portion with regard to the direction of the long axis thereof as a distance from the middle position increases.

2. The magnetic sensor according to claim 1, wherein an entire circumference of the element portion is formed of a curved line, as viewed in the direction that is perpendicular both to the short axis and to the long axis of the element portion.

3. The magnetic sensor according to claim 1, wherein a part of a circumference of the element portion overlaps with the imaginary ellipse, as viewed in the direction that is perpendicular both to the short axis and to the long axis of the element portion.

4. The magnetic sensor according to claim 3, wherein the part of the circumference of the element portion includes the middle position.

5. The magnetic sensor according to claim 4, wherein a part of the circumference of the element portion that does not overlap with the imaginary ellipse is formed of a curved line.

6. The magnetic sensor according to claim 4, wherein a part of the circumference of the element portion that does not overlap with the imaginary ellipse is formed of a straight line.

7. The magnetic sensor according to claim 3, wherein the part of the circumference of the element portion is positioned at the middle position and the end of the element portion with regard to the direction of the long axis, and parts of the circumference of the element portion that are interposed by the middle position and the end are formed of straight lines.

8. A magnetic sensor comprising:
- an element portion that is elongate and that exhibits a magnetoresistive effect;
- the element portion is non-oval and is arranged in an imaginary ellipse, wherein the imaginary ellipse has a major axis that connects both ends of the element portion with regard to a direction of a long axis thereof to each other and a minor axis that connects both ends of the element portion with regard to a direction of a short axis thereof to each other, as viewed in a direction that is perpendicular both to the short axis and to the long axis of the element portion, wherein
- a width of the element portion with regard to the direction of the short axis thereof decreases from a middle position of the element portion with regard to the direction of the long axis thereof toward the end of the element portion with regard to the direction of the long axis thereof, and
- at least a part of a circumference of the element portion is formed of a curved line.

9. The magnetic sensor according to claim 8, wherein an entire circumference of the element portion is formed of a curved line, as viewed in the direction that is perpendicular both to the short axis and to the long axis of the element portion.

10. The magnetic sensor according to claim 8, wherein a rate of a change in the width of the element portion in the direction of the long axis gradually decreases from the middle position toward the end of the element portion in the direction of the long axis.

11. The magnetic sensor according to claim 8, wherein a rate of a change in the width of the element portion in the direction of the long axis decreases toward the end of the element portion in the direction of the long axis in parts that are between the middle position and the end and that are away from the middle position and the end, and the rate increases toward the end in parts near the middle position and the end.

12. The magnetic sensor according to claim 8, wherein a rate of a change in the width of the element portion in the direction of the long axis is at least partly constant.

13. A magnetic sensor comprising:
- an element portion that is elongate and that exhibits a magnetoresistive effect;
- the element portion is non-oval and is arranged in an imaginary ellipse, wherein the imaginary ellipse has a major axis that connects both ends of the element portion with regard to a direction of a long axis thereof to each other and a minor axis that connects both ends of the element portion with regard to a direction of a short axis thereof to each other, as viewed in a direction that is perpendicular both to the short axis and to the long axis of the element portion, wherein
- a width of the element portion with regard to the direction of the short axis thereof decreases from a middle position of the element portion with regard to the direction of the long axis thereof toward the end of the element portion with regard to the direction of the long axis thereof, and
- a rate of a change in the width of the element portion in the direction of the long axis is not constant between the middle position and the end.

14. The magnetic sensor according to claim 13, wherein a rate of a change in the width of the element portion in the direction of the long axis decreases from the middle position toward the end of the element portion in the direction of the long axis.

15. The magnetic sensor according to claim 13, wherein a rate of a change in the width of the element portion in the direction of the long axis decreases toward the end of the element portion in the direction of the long axis in parts that are between the middle position and the end and that are away both from the middle position and from the end, and the rate increases toward the end in parts near the middle position and the end.

16. The magnetic sensor according to claim 13, wherein a rate of a change in the width of the element portion in the direction of the long axis is at least partly constant.

17. The magnetic sensor according to claim 13, wherein a part of a circumference of the element portion overlaps with the imaginary ellipse, as viewed in the direction that is perpendicular both to the short axis and to the long axis of the element portion.

* * * * *